(12) United States Patent
Oku

(10) Patent No.: US 6,925,865 B2
(45) Date of Patent: Aug. 9, 2005

(54) TIRE INFORMATION PROVIDING METHOD AND A PROVIDING APPARATUS

(75) Inventor: Masahiro Oku, Kobe (JP)

(73) Assignee: Sumitomo Rubber Industries, Ltd., Kobe (JP)

( * ) Notice: Subject to any disclaimer, the term of this patent is extended or adjusted under 35 U.S.C. 154(b) by 1 day.

(21) Appl. No.: 10/752,719

(22) Filed: Jan. 8, 2004

(65) Prior Publication Data

US 2004/0144168 A1 Jul. 29, 2004

(30) Foreign Application Priority Data

Jan. 10, 2003 (JP) ........................................ 2003-004865

(51) Int. Cl.$^7$ .......................................... G01M 17/02
(52) U.S. Cl. ....................................................... 73/146
(58) Field of Search ................................ 73/146, 146.2, 73/8, 118.1; 702/140, 82; 152/154.1, 454, 548, 556, 527; 703/1, 3, 6, 7, 12

(56) References Cited

U.S. PATENT DOCUMENTS 6,199,026 B1 * 3/2001 Shiraishi et al. ............ 702/140
6,360,593 B1 * 3/2002 Schoenfeld .................. 73/146
6,729,179 B2 * 5/2004 Crema et al. ................. 73/146
6,739,185 B2 * 5/2004 Schoeninger ................ 73/146

FOREIGN PATENT DOCUMENTS

| JP | 2001-249987 A | 9/2001 |
| JP | 2001-297182 A | 10/2001 |
| JP | 2001-331534 A | 11/2001 |
| JP | 2002-000787 A | 1/2002 |
| JP | 2002-024522 A | 1/2002 |
| JP | 2002-032454 A | 1/2002 |
| JP | 2002-042074 A | 2/2002 |

* cited by examiner

Primary Examiner—William Oen
(74) Attorney, Agent, or Firm—Birch, Stewart, Kolasch & Birch, LLP

(57) ABSTRACT

The present invention relates to tire information providing method for providing information on at least one kind of tire to customer comprising the steps of: setting at least one kind of tire of which information is to be provided; setting at least one kind of road surface condition on which said tire is made to run; setting at least one kind of mounting condition for mounting said tire; setting at least one kind of evaluation parameter of said tire that is being wanted by said customer; performing tire rolling simulation based on said tire, said road surface condition and said mounting condition getting said evaluation parameter from said tire rolling simulation; and providing information comprising said evaluation parameter to said customer.

10 Claims, 20 Drawing Sheets

TMDF1

Tire model database

| NO. | Name of manufacturer | Model number | Ellipticity (%) | Rim diameter (inches) | Tire size | Tire model name |
|-----|----------------------|--------------|-----------------|------------------------|-----------|-----------------|
| 1 | ------- | LM702 | 60 | 16 | 205/60R16 | TMDF1 |
| 2 | ------- | LM702 | 60 | 16 | 215/60R16 | TMDF2 |
| 3 | ------- | LM702 | 60 | 16 | 225/60R16 | TMDF3 |
| 4 | ------- | LM702 | 60 | 16 | 205/60R16 | ⋮ |
| 5 | | ⋮ | ⋮ | ⋮ | | |

WMDF1

Wheel model database

| NO. | Name of manufacturer | Model number | Size | Rim diameter (inches) | P.C.D | Number of holes | Off-set | Wheel model name |
|-----|---------------------|--------------|------|----------------------|-------|-----------------|---------|------------------|
| 1 | ------ | ROZE○△ | 7.5 | 18 | 114.3 | 5 | 43 | WMDF1 |
| 2 | ------ | ROZE○△ | 8.0 | 18 | 114.3 | 5 | 43 | WMDF2 |
| 3 | ------ | ROZE○△ | 9.0 | 18 | 114.3 | 5 | 43 | ------ |
| 4 | ------ | ⋮ | ⋮ | ⋮ | ⋮ | ⋮ | ⋮ | ------ |
| 5 |  | ⋮ | ⋮ | ⋮ | ⋮ | ⋮ |  |  |

FIG.9

Car body model database

| NO. | Name of manufacturer | Type | Model year | Suspension (front) | Suspension (rear) | Car body model name |
|---|---|---|---|---|---|---|
| 1 | ○△□ | AB-5 | H12 | W Wishbone | Strut | VMDF1 |
| 2 | ... | AB-5 | H14 | ... | ... | ... |
| 3 | ... | ... | ... | ... | ... | ... |
| 4 | ... | ... | ... | ... | ... | ... |
| 5 | ... | ... | ... | ... | ... | ... |

FIG.10(A)
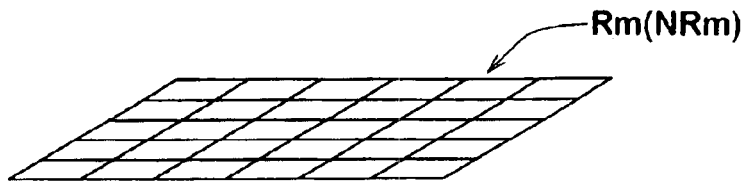
RMDF1
FIG.10(B)
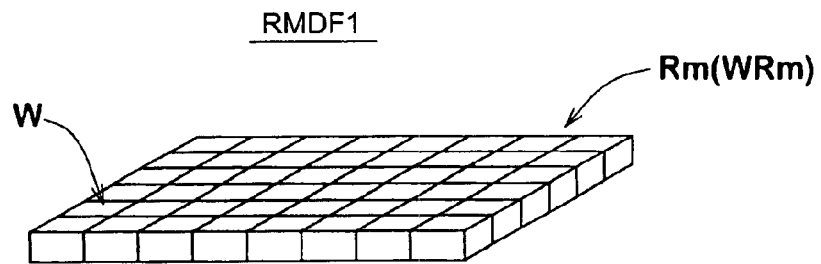
RMDF2
FIG.10(C)
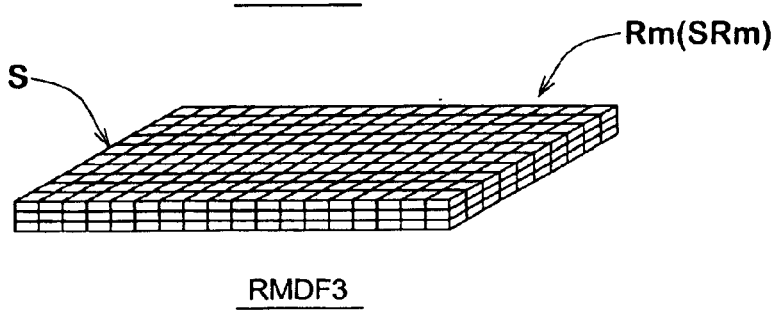
RMDF3
FIG.11
Road surface model database
| NO. | Road surface condition | $\mu$ | Thickness of water film | Thickness of snow | Road surface model name |
|---|---|---|---|---|---|
| 1 | Dry asphalt | 0.98 | 0 | 0 | RMDF1 |
| 2 | Wet road | 0.88 | 10 | 0 | RMDF2 |
| 3 | Snowy road | 0.70 | 0 | 10 | RMDF3 |
| 4 | ⋮ | ⋮ | ⋮ | ⋮ | ⋮ |
| 5 | ⋮ | ⋮ | ⋮ | ⋮ | ⋮ |
| 6 | | | ⋮ | ⋮ | ⋮ |

Duration of service of the tire
(number of months)

Running distance of tire (km)

FIG.15

Customer information database

| NO. | Name of customer | E-mail address | Type of vehicle of ownership | Tire of ownership | Tire 1 of which information has been provided | Tire 2 of which information has been provided | Simulation conditions |
|---|---|---|---|---|---|---|---|
| 1 | Mr. XX, Ichiro | OxxO@xO.jp | AB-5 | ZAB | TMDF1, 205/60 | TMDF2 | •Evaluation parameters; •speed; ... |
| 2 | ... | ... | ... | ... | ... | ... | |
| 3 | ... | ... | ... | ... | ... | | |
| 4 | | | | | | | |
| 5 | | | | | | | |

FIG.16

Evaluation parameter database

| NO. | Evaluation parameter | Calculation parameter |
|---|---|---|
| 1 | Riding comfort 1 | Fluctuations in upward and downward forces |
| 2 | Riding comfort 2 | Fluctuations in frontward and rearward forces |
| 3 | Stability of steering | Cornering power |
| 4 | Wear performance | Wear energy |
| 5 | ⋮ | ⋮ |
| 6 | | |

US 6,925,865 B2

TIRE INFORMATION PROVIDING METHOD AND A PROVIDING APPARATUS

This Non-provisional application claims priority under 35 U.S.C. §119(a) on Patent Application No(s). 2003-4865 filed in Japan on Jan. 10, 2003, the entire contents of which are hereby incorporated by reference.

BACKGROUND OF THE INVENTION

1. Field of the Invention

The present invention relates to a tire information providing method and an apparatus thereof capable of providing on-target tire information that is truly wanted by the customer.

2. Description of the Prior Art

Conventionally, provision of tire information is mostly unilaterally directed from tire manufacturers to customers. Tire manufacturers provide information on riding comfort, sport performance, wet performance, or silence of respective tires through media such as TV commercials, newspapers, magazines, catalogues or the Internet.

However, what concerns the customer most is not general information of tires but the degree of improvements of performance when certain tires are attached to one's own vehicle. In other words, information related to tires that a customer truly desires depends entirely from customer to customer. More particularly, the following pieces of information are being desired.

(1) While I am currently wearing wheels A and tires A on my vehicle A, I want to know the change in riding comfort when the tires are changed to tires B, C or D . . . .

(2) While I am currently wearing wheels A and tires A on my vehicle A, I want to know which tires I should choose to improve the wet performance.

(3) While I am currently wearing wheels A and tires A on my vehicle A, I want to know the safety when running on a snowy road with this combination.

(4) While I am currently wearing wheels A and tires A on my vehicle A, I want to know how the running performance changes when I change to vehicle B.

It was conventionally quite difficult to provide such pieces of information that meet individual requests of customers. The only possible method was to actually make a test drive. However, such a method is not realistic since it will require much trouble and time to customers, tire manufactures or tire sales offices. Moreover, such tests are largely dependent on feeling and thus lack in objectivity.

SUMMARY OF THE INVENTION

The present invention has been devised in view of the above-described circumstances. More particularly, in the present invention, at least one tire, road surface condition, tire mounting condition and evaluation parameter are set at requests of customers and simulations are performed on a computer on the basis of those conditions for calculating evaluation parameters. By providing those evaluation parameters to customers, it is possible to provide on-target tire information in accordance with various needs of customers. This is the main object of the present invention.

The method of the present invention is a tire information providing method for providing information on at least one tire to a customer comprising the steps of:

setting at least one kind of tire of which information is to be provided;

setting at least one kind of road surface condition on which said tire is made to run;

setting at least one kind of mounting condition for mounting said tire; setting at least one kind of evaluation parameter of said tire that is being wanted by said customer;

performing tire rolling simulation based on said tire, said road surface condition and said mounting condition getting said evaluation parameter from said tire rolling simulation; and providing information comprising said evaluation parameter to said customer.

The apparatus of the present invention is a tire information providing apparatus for providing tire information to a customer comprising:

a data storing portion including at least one tire model database for storing two or more kind of tire models that can be simulated, a road surface model database for storing two or more kind of road surface models that can be simulated, and a car body model database for storing two or more kind of body models that can be simulated;

a control portion for setting a vehicle model on the basis of said tire models and said car body model that have been preliminarily set by the customer and for performing simulation upon making said vehicle model run on said road surface model that has been set by the customer; and an output portion for providing at least one evaluation parameter that has been preliminarily determined by the customer to the customer.

According to the tire information providing method of the present invention, condition such as tire, road surface, mounting method and evaluation parameter are combined such that tire information corresponding to needs varying from customer to customer can be set and provided. Accordingly, it is possible to the customer with only those pieces of on-target information that a customer truly wants to the customer. This not only meets demands of customers to provide satisfaction but also leads to expanded sales of tires. When setting two or more kind of conditions and providing each evaluation parameter in a comparable manner while varying conditions, customer may even better understand differences in tire performances. Since customers may learn general tire performance without the necessity of performing actual test drives or similar, labor of both, the tire manufactures and customers can be remarkably reduced.

BRIEF DESCRIPTION OF THE DRAWINGS

FIG. 9 is a diagram illustrating one example of a car body model database in visualized form;

FIGS. 10(A) to 10(C) are perspective views illustrating one example of a road surface model in visualized form;

FIG. 11 is a diagram illustrating one example of a road surface model database in visualized form;

FIG. 15 is a diagram illustrating one example of a customer information database in visualized form;

FIG. 16 is a diagram illustrating one example of an evaluation parameter database in visualized form;

DESCRIPTION OF THE PREFERRED EMBODIMENTS

Figure 1:
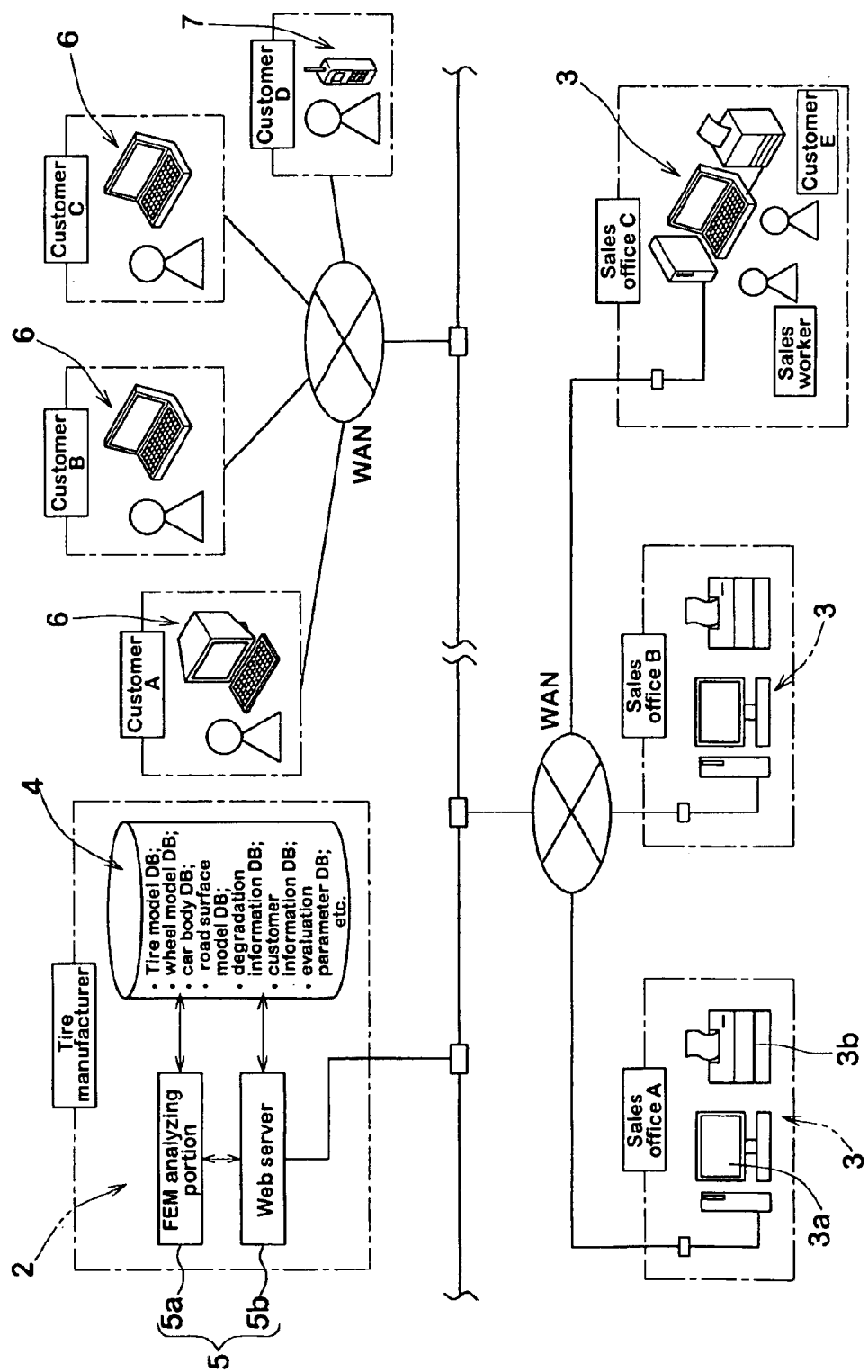
FIG. 1 is a block view illustrating one example of a tire information providing apparatus.

While a preferred embodiment of the present invention will now be explained on the basis of the drawings, the following descriptions are merely illustrative, and the present invention is not to be interpreted by limiting the same to such an embodiment. FIG. 1 is a block diagram illustrating one example of a tire information providing apparatus (hereinafter also simply referred to as "the apparatus") 1 of the present embodiment. According to the apparatus and method of the present embodiment, pieces of tire information that are being wanted by customers are collected and provided on-target. Pieces of tire information meeting demands of customers are identified by using setting condition for at least one kind of tire, wheel, car body, road surface or evaluation parameter etc. Simulation, in which tire is made to run on a computer, is performed on the basis of the condition that has been set by the customers. The set evaluation parameter is calculated through the simulation, and the results are provided to the customers. More detailed explanations will now follow.

According to one preferred embodiment of the apparatus 1, a main computer 2 executing above simulations is provided, for instance, at a tire manufacturer side. A plurality of client computers 3 or 6 connected to the main computer 2 through a network are provided at sales offices A, B, C . . . of the tire manufacturer and at customer sides A, B, C . . . . The client computers 3 or 6 and the main computer 2 are interconnected to allow sending and receiving of required information.

The main computer 2 includes a data storing portion 4 on which various databases and others are stored, and a control portion 5 for performing specified processes by using information stored on the data storing portion 4. The data storing portion 4 maybe comprised, for instance, of a magnetic disk, wherein files of a tire model database, a wheel model database, a body model database, a road surface model database, a degradation information data portion, a customer information database or an evaluation parameter database are stored.

Figures 2, 3:
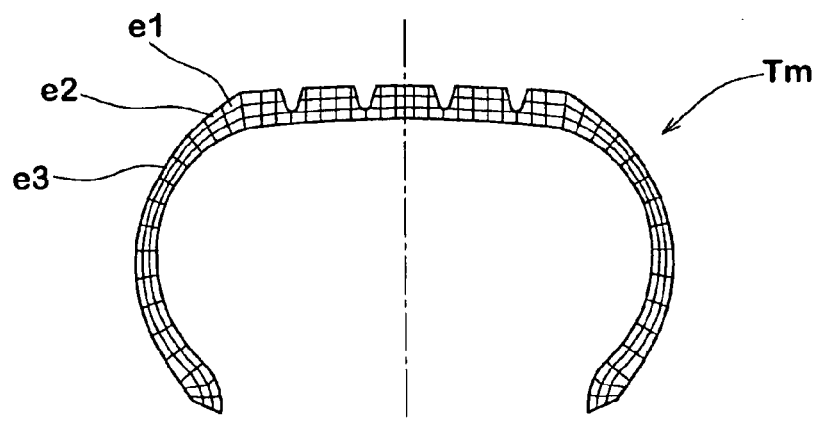
FIG. 2 is a sectional view illustrating one example of a tire model in visualized form.
FIG. 3 is a diagram illustrating one example of a tire model database in visualized form.

The tire model database stores therein two or more kind of tire models Tm that are used for numeric simulation as illustrated in FIG. 2 in visualized form. The respective tire model represent physical tires that are object of analysis replaced by a collection of a minute finite number of elements e1, e2, . . . . More particularly, coordinates of nodes of respective elements, element numbers, element shapes (solid elements, flat elements), or material properties (elasticity, attenuation coefficients, density) are stored as numeric data. The following and other models are arranged such that numerical analysis can be performed through finite element method in the present embodiment.

The respective tire models Tm is modeled including tread patterns, inner structural materials (carcass, belts, bead cores etc.) and rubber properties (elasticity of rubber materials) of actual tires for achieving even more accurate simulation results. However, the present invention is not to be limited to such an embodiment.

FIG. 3 illustrates the entire tire model database in visualized form. The tire model database includes two or more kind of tire models having different tire size, aspect ratio, or model number (whereby differences are caused in tread patterns and inner structures of tires). The respective tire models Tm are assigned with individual tire model names. According to the present embodiment, one tire model is comprised of one file (in FIGS. 2 and 3, "TMDF1").

The tire model database is arranged in that, for instance, one piece of information for managing one tire model Tm is stored on a single record (line). More particularly, items such as "manufacturer name" that manufacture the tire, "model number" for specifying the tire, "aspect ratio" of the tire, "rim diameter" of the tire, and "tire size" of the tire, and "tire model name" (above-mentioned file names) in which the tire has been modeled.

It is possible to realign respective items or to designate values for the respective items for retrieving ones that coincide among this tire model database. In other words, the customer may browse the tire model database to easily determine at least one kind of tire the customer wants to be informed about and a corresponding tire model Tm. Further, modeling of all the tire models Tm is performed in the present embodiment on the basis of new tires. Accordingly, the respective tire models are in conditions in which no wear or degradations in rubber are included.

Figures 4, 5:
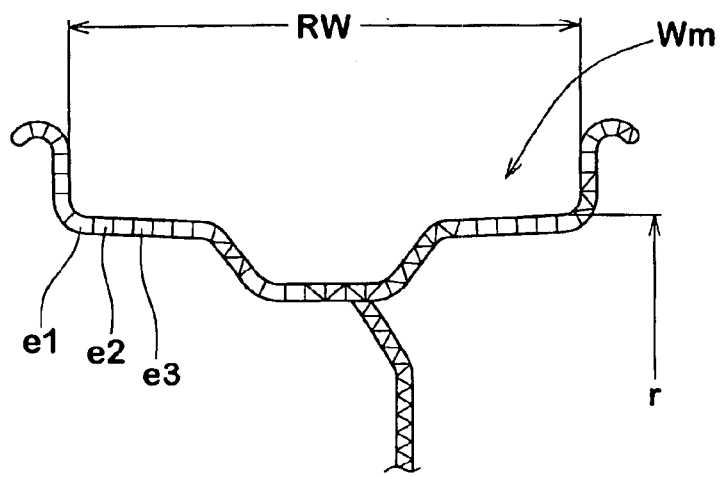
FIG. 4 is a sectional view illustrating one example of a wheel model in visualized form.
FIG. 5 is a diagram illustrating one example of a wheel model database in visualized form.

As illustrated in FIG. 4 in visualized form, the wheel model database stores therein two or more kind of wheel models Wm that are used for the simulation. The respective wheel models Wm represent physical wheels that are object of analysis replaced by a collection of a minute finite number of elements e1, e2 . . . . More particularly, coordinates of nodes of respective elements, element numbers, element shapes, or material properties are stored as numeric data, similar to the case with the tire models. A plurality of wheel models Wm of different rim diameter r and rim width RW are included. The respective wheel models Wm are assigned with individual wheel model names, and according to the present embodiment, one wheel model is comprised of one file (in FIG. 4, "WMDF1").

FIG. 5 illustrates the entire wheel model database in visualized form.

The wheel model database is arranged in that, for instance, one piece of information for managing one wheel model Wm is stored on a single record (line). More particularly, items such as "manufacturer names" that manufacture the wheels, "model numbers" for specifying the wheel, "size", "rim diameter", "P.C.D" of the wheel, "numbers of holes" for mounting the wheel to shaft, "off-set", and "wheel model name" (above-mentioned file name) in which the wheel has been modeled.

Similar to the tire model database, it is also possible to realign respective items or to designate values for the respective items for retrieving ones that coincide in the wheel model database. The customer may, for instance, browse the wheel model database to easily determine at least one wheel the customer wants to be informed about and a corresponding wheel model Wm.

Figure 6:
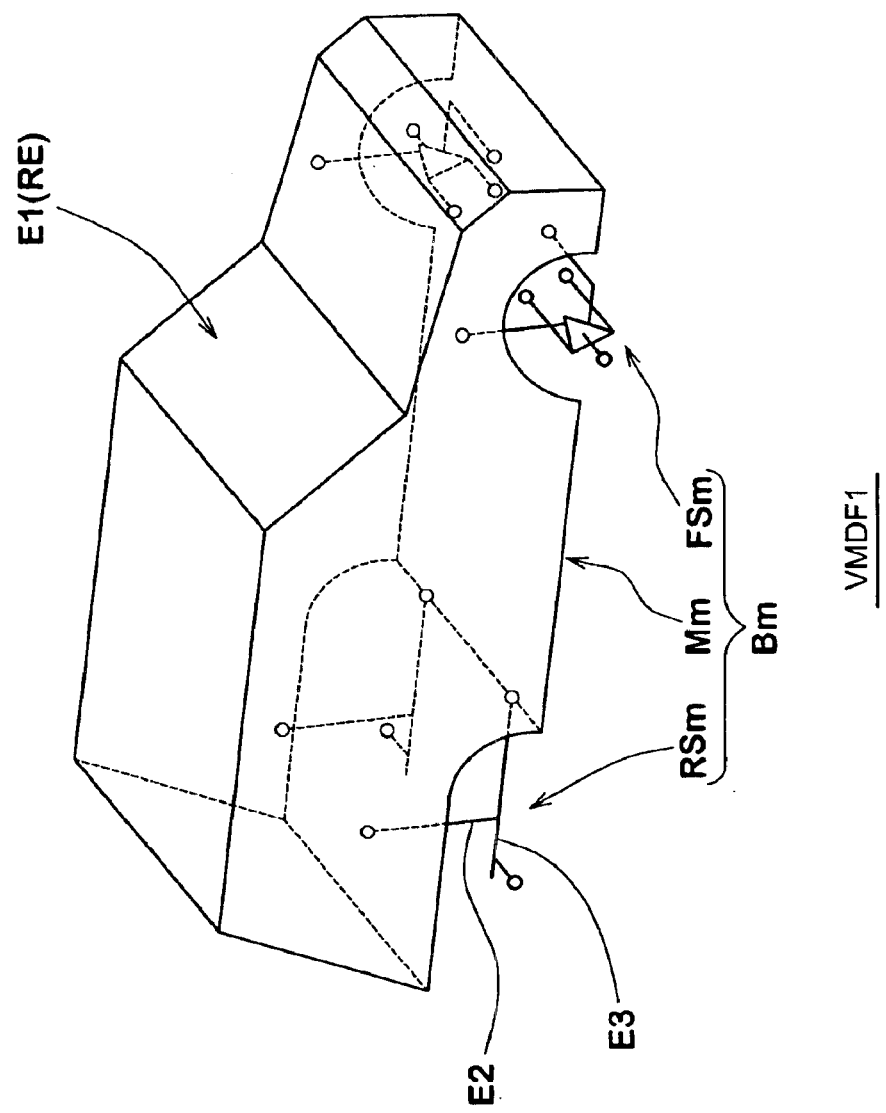
FIG. 6 is a sectional view illustrating one example of a car body model in visualized form.

As illustrated in visualized form in FIG. 6, the car body database stores therein two or more kind of car body models Bm that are used for the numeric simulation. The respective body models Bm represent physical car bodies that are object of analysis replaced by a collection of a finite number of elements E1, E2, . . . . According to this embodiment, one body model Bm comprises a main body model Mm, right and left front suspension models FSm disposed in a front portion thereof, and right and left rear suspension models RSm disposed in a rear portion of the main body model Mm.

Weights, coordinates of center of gravity positions, and moments of inertia are defined for the car main body models Mm. For reducing the amount of calculation, it is preferable to define the car main body models Mm by rigid elements RE that are not deformed through action of external force. It is not necessary to perform modeling of portions such as the interior members that do substantially not contribute to motional performances of the vehicle, and it is desirable to model only major exterior members. However, it is also possible to define the car main body models Mm upon providing deformation properties or oscillation properties or the like that are close to those of materials that are used in actual vehicles, depending on the performance of a calculator in a FEM analyzing portion 5a to be described later. In such a case, it is possible to perform even more accurate analysis.

Figure 7A:
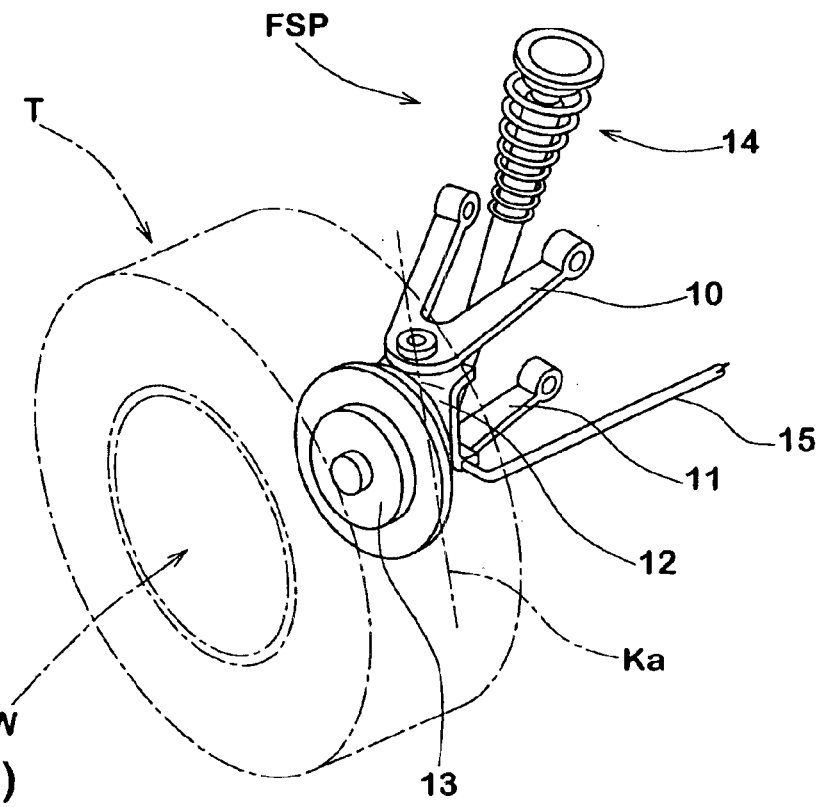
FIG. 7(A) is a schematic view of a front suspension.

In the front suspension models FSm and the rear suspension models RSm, physical suspensions that are object of modeling are modeled by using a finite number of elements that may be simulated by using a computer. FIG. 7(A) illustrates one example of a front suspension device FSP that is object of analysis and FIG. 7(B) illustrates a front suspension model FSm that has been modeled.

The front suspension device FSP comprises, for instance, an upper arm 10 which one end is pivotally supported at the car main body, a similarly arranged lower arm 11, a knuckle 12 that is supported at the other ends of the respective arms 10, 11, a hub portion 13 that is fixedly attached to the knuckle 12 in a rotating manner and that fixedly attaches a wheel W attached with a tire T, and a spring-loaded damper 14 that is interposed between the knuckle 12 and the car main body. In this respect, a stabilizer 15 for improving the twist rigidity which one end is fixedly attached to the knuckle 12 and which other end is fixedly attached to the car main body is fixedly attached to the knuckle 12. Such a front suspension device FSP can assign slip angles to the tire T by tilting the knuckle 12 around a kingpin axis Ka.

Figure 7B:
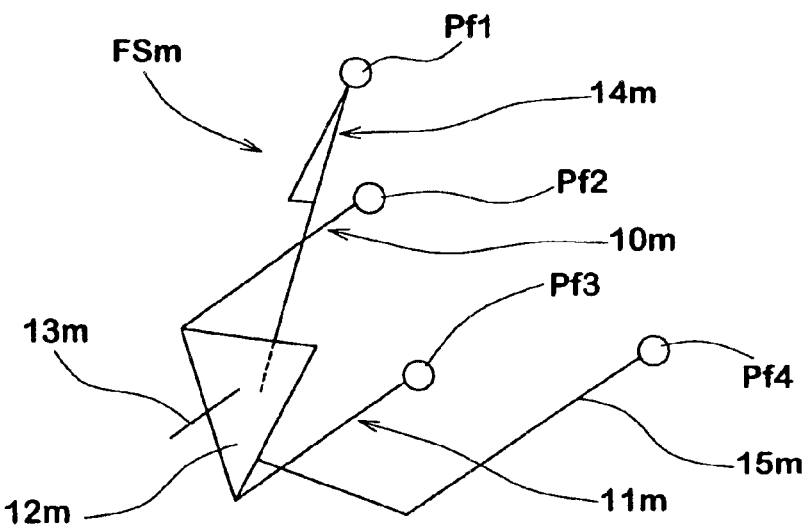
FIG. 7(B) is a diagram in modeled form.

The front suspension model FSm shown as FIG. 7(B) comprises an upper arm model 10m and a lower arm model 11m in which the upper arm 10 and the lower arm 11 are modeled, a knuckle model 12m in which the knuckle 12 is modeled, a hub model 13m in which the hub portion 13 is modeled, a spring-loaded damper model 14m in which the spring-loaded damper 14 is modeled, and a stabilizer model 15m in which the stabilizer 15 is modeled.

Figure 8A:
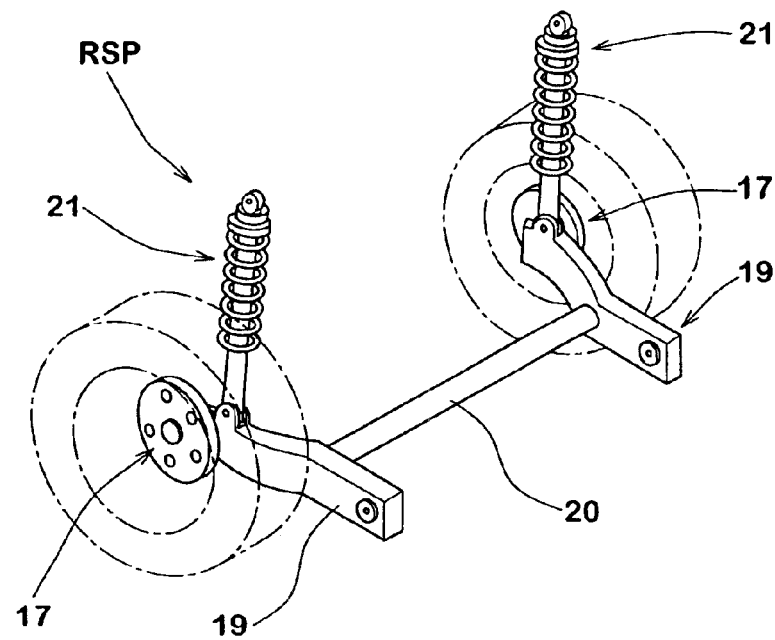
FIG. 8(A) is a schematic view of a rear suspension.
Figure 8B:
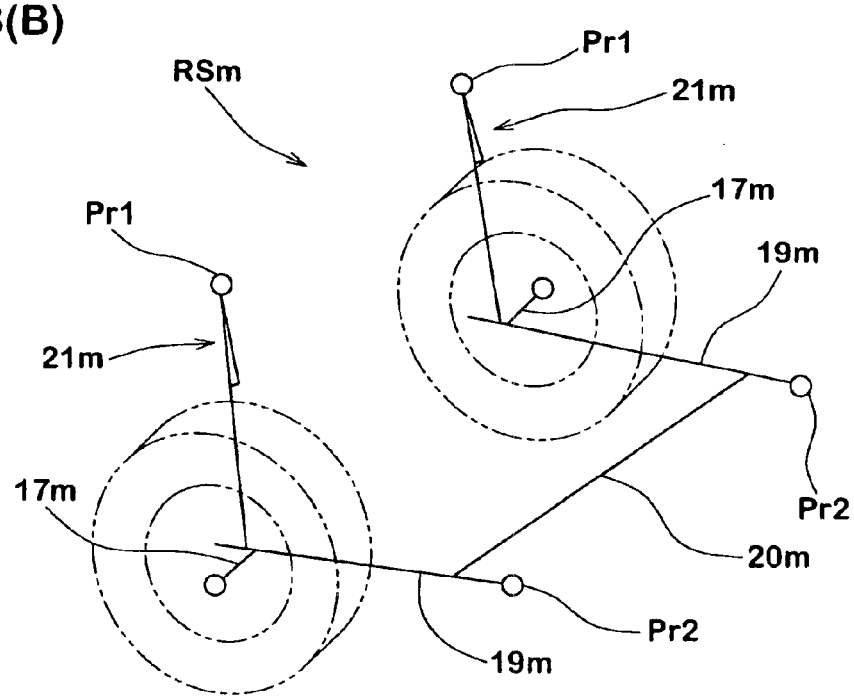
FIG. 8(B) is a diagram in modeled form.

FIG. 8(A) illustrates one example of a schematic view of the rear suspension device RSP that is object of modeling, and FIG. 8(B) illustrates a rear suspension model RSm in which the above device has been modeled. The rear suspension device RSP comprises a pair of trading arms 19, 19 which one end portions are pivotally attached to the car main body and which other end portions include rotatable hubs 17 for mounting the wheels thereto, a torsion beam 20 for connecting between the pair of trading arms 19, 19, and spring-loaded dampers 21, 21 disposed between the torsion beam 20 and the car main body (omitted in the drawing).

The rear suspension model RSm comprises a hub model 17m in which the hub 17 is modeled, a trading arm model 19m in which the trading arms 19 are modeled, a torsion beam model 20m in which the torsion beam 20 is modeled, and a spring-loaded damper model 21m in which the spring-loaded dampers 21 are modeled.

The respective suspension models FSm, RSm are established such that they can express mechanical movements. For instance, the spring-loaded damper models 14m, 21m are defined by linear or non-linear spring elements. Accordingly, telescopic motion in the axial direction is permitted through external force, and internal force is generated in accordance with the amount of telescopic motion. The hub models 13m, 17m or the arm models 10m, 11m and 19m are respectively defined as rigid body elements. The stabilizer model 15m or the torsion beam model 20m generate a torsion angle through torsional forces, and are modeled as beam elements of torsion generating reaction force accordingly.

Connecting points Pf1, Pf2 . . . , Pr1, Pr2 . . . that are fixed to the car main body model Mm are defined in the suspension models FSm, Rsm. The respective connecting points Pf1 to Pf4 of the front suspension model FSm are fixed points that are fixedly attached to a front portion of the car main body model Mm and which relative positions do not change with respect to each other. Similarly, the respective connecting points Pr1, Pr2 of the rear suspension model RSm are also fixedly attached to a rear portion of the main body model Mm to be described later as fixed points.

For the respective elements constituting the suspension model, weights, center of gravity positions, and moments of inertia around the center of gravity are defined. For the spring-loaded damper models 14m, 21m, spring coefficients and damper attenuation constants are defined. For the beam elements, flexural rigidities and torsional rigidities are defined. For joint portions (nodes) between the respective elements, joint conditions that are based on respective conditions of the connecting portions are defined. Such joint conditions include rigid junction in which members are fixed to be unmovable, slide junction in which members are movable in axial directions, joint junction in which members may rotate and pivot in a multiaxial manner or a rotating joint junction in which members are pivotable around a single axis. Manners of deformation of such suspension models FSm, RSm upon action of lateral force in cases of application of load or performing turning movements can be simulated on a computer, substantially in a pattern that is similar to a case when using a suspension device of an actual vehicle.

The car body model Bm includes a plurality of different manufacturers, model numbers and model years. Respective car body models Bm are assigned with respective specific body model names. A single car body model is comprised of one file (in FIG. 6, "VMDF1") in the present embodiment. In this respect, all of the body models Bm are illustrated in that they have been modeled on the basis of new car bodies in the present embodiment.

FIG. 9 illustrates the entire car body model database in visualized form.

In the car body model database, information for managing one car body model Bm is stored, for instance, on a single record. More particularly, items such as "name of manufacturer" that manufactures the car body, "model" for defining the vehicle body, "model year" of the car body, shapes of front and rear "suspension" and "car body model name" (above-mentioned file name) in which the vehicle has been modeled are included. Accordingly, it is possible to realign respective items or to designate values for the respective items for retrieval among the car body model database, similar to the tire model database and others. The customer may use the car body model database to easily retrieve and determine at least one car body he or she wants to be informed about and a vehicle model Bm which is a modeled version thereof.

As illustrated in FIGS. 10(A) to (C) in visualized formed, the road surface model database stores therein two or more kind of road surface models Rm that are used for numeric simulations. The road surface models Rm represent travel road surfaces that are object of analysis replaced into a finite number of elements e1, e2 . . . in divided form. More particularly, coordinates of nodes of respective elements, element numbers, or element shapes are stored as numeric data, similar to the tire models.

The road surface models Rm include those of a plurality of different friction coefficients of surfaces. For example, it is possible to include a normal dry asphalt road surface model NRm, a wet road surface model WRm including a water model W in which water of a specified thickness is modeled on a surface thereof, or a snowy road surface model SRm including a snow model S in which snow of a specified thickness is modeled on a surface thereof. The asphalt road surface model NRm may be defined, for instance, by using the rigid body elements. The water model W and the snow model S can be simply modeled by using, for instance, Euler elements. The respective road surface models Rm are assigned with respective peculiar road surface model names. It is also possible to include, in addition to the above, road surface models for sandy grounds or muddy grounds. One surface ground model is comprised of a single file (in FIG. 10, "RMDF1 to 3").

FIG. 11 illustrates the entire road surface model database in visualized form.

The road surface model database stores therein information for managing one road surface model Rm, for instance, on a single record in a correlated manner. More particularly, pieces of information including items such as "road surface conditions", "$\mu$" representing road surface friction coefficient, "thickness of water film", "thickness of snow", and "road surface model names" (above-mentioned file names) are illustrated on a single record. Similarly to the tire model database, it is possible to realign respective items or to designate values for the respective items for retrieval among the road surface model database. The customer may use the road surface model database to easily retrieve and determine at least one road surface condition he or she wants to be informed about and a road surface model Rm which is a modeled version of the road surface condition.

The degradation information database stores therein at least one degradation parameter for reflecting age-related degradation of the tire or the car body to numeric simulation. For instance, when the duration of service of tire becomes large, the rubber will harden, and the amount of wear will become large in substantial proportion to the running distance. As for the car body, the spring constant of the suspension will become less the longer the running distance becomes. In the present embodiment, such phenomena of age-related degradation will be incorporated in the simulation by using the degradation parameter. This makes simulation results come closer to actual results to thereby improve the accuracy of calculation.

Figure 12:
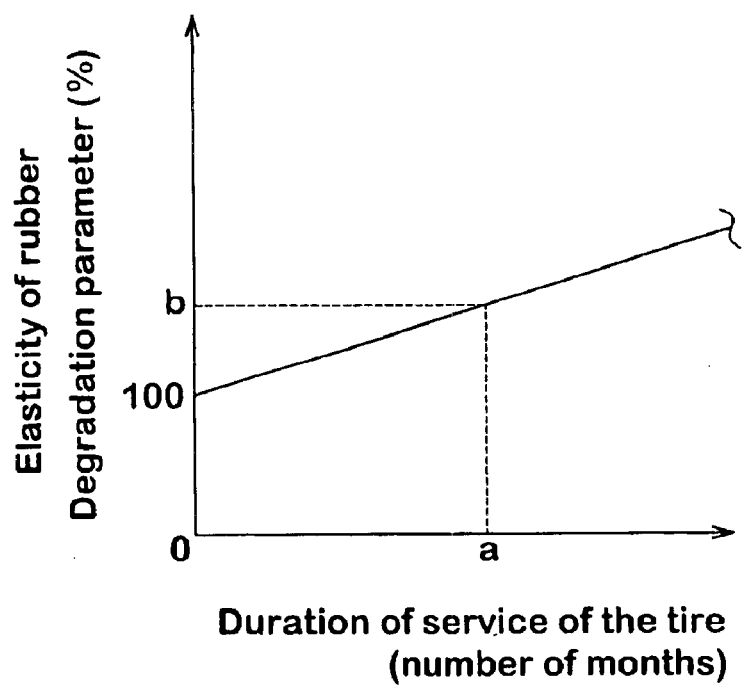
FIG. 12 is a graph illustrating a relationship between degradation parameters of the elasticity of rubber and the number of months during which a tire has been used.

FIG. 12 illustrates one example of a relationship between the duration of service of a tire and a degradation parameter related to the elasticity of the tire rubber. With an increase in the duration of service of the tire, the degradation parameter related to the elasticity of the rubber will gradually increase. For instance, where the duration of service of a tire of a customer is given as "a", the degradation parameter as "b" (%), and the elasticity of a new tire rubber as "c", the elasticity of the tire rubber of the customer can be corrected by the following equation.

$$c \times b/100$$

By this degradation parameter b, it is possible to express rubber hardening in accordance with one tire used by the customer.

Figure 13:
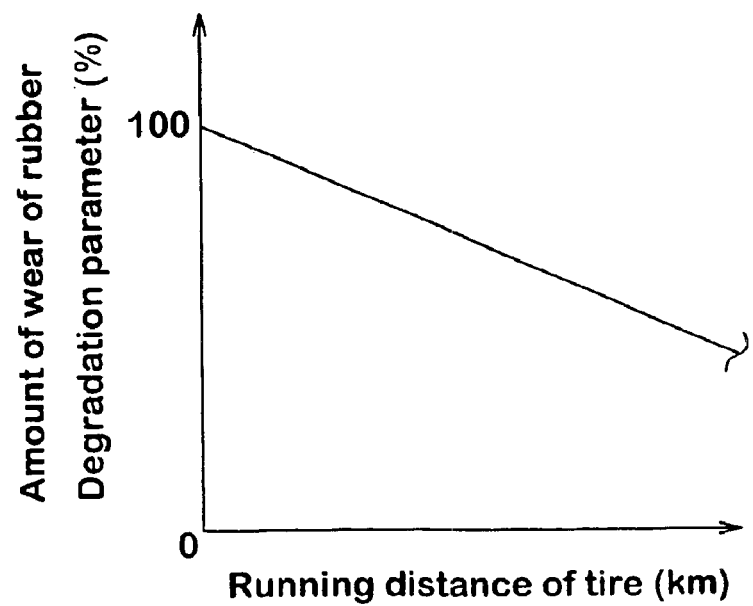
FIG. 13 is a graph illustrating a relationship between degradation parameter of the wear rate of tread and the running distance of the tire.

FIG. 13 illustrates one example of a relationship between the running distance of a tire and the amount of wear of the tire. With an increase in the running distance of the tire, degradation parameter related to the amount of wear of the tire will be reduced in a substantially proportional manner. The degradation parameter is multiplied by depth of tread grooves of the tire model that have been modeled on the basis of the new tire. With this arrangement, the tire model of new product can be corrected to those of used tire with shallow tread grooves that have run arbitrary running distances.

Figure 14:
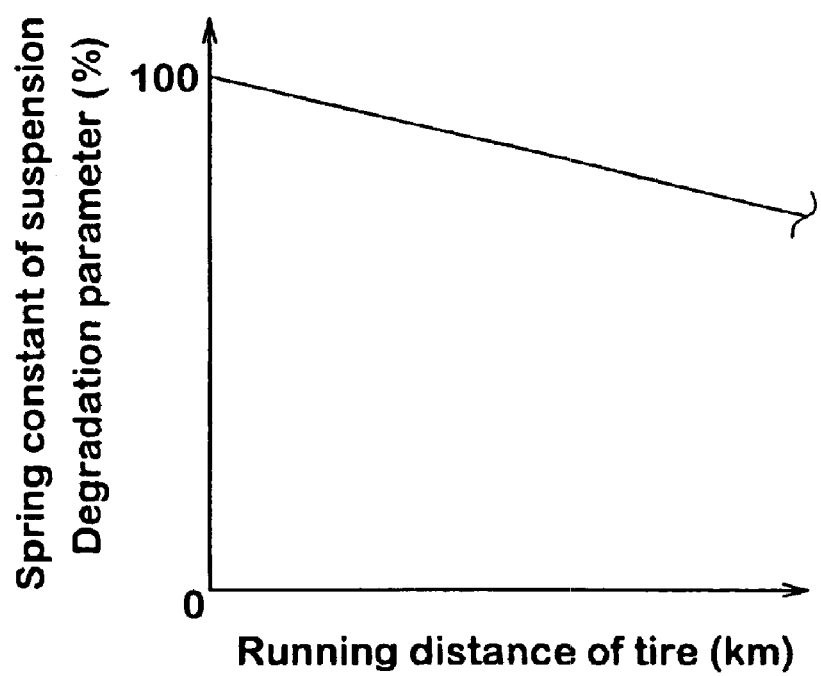
FIG. 14 is a graph illustrating a relationship between degradation parameter of spring coefficient of a suspension and the running distance of the tire.

FIG. 14 further illustrates one example of a relationship between the running distance of a tire and degradation parameter of spring constant of suspension of a car body. With an increase in the running distance of the tire, the spring constant of the suspension will become smaller. The degradation parameter of spring constant is for performing such corrections. By multiplying such degradation parameter to the spring constant defined for the suspension model of the car body model, it is possible to reduce the spring constant in accordance with the condition of use.

New tires that have been bought by a customer who owns a vehicle are exchanged with used tires that are being presently used. Accordingly, no actual comparison of performances can be made upon comparing performances in which the tires, which had been used by the customer, were in new conditions with performances of new tires the customer intends to buy, and it may happen that impressions other than those of information that has been provided to the customer are given. By using degradation parameters as in the present embodiment, it is possible to eliminate such inconveniences. The degradation information data portion stores the degradation parameters in form of functions or in a table style. While the present embodiment has been illustrated in that degradation parameters have been set with respect to tire models and suspension models, it is possible to define them for wheels and others.

As illustrated, for instance, in FIG. 15 in visualized form, the customer information database stores customer information of one customer on a single record (line). In the present embodiment, one record includes items such as "name of customer", "e-mail address", "model of vehicle" owned by the customer, "owned tire" currently used by the customer, "tire 1 of which information has been provided", "tire 2 of which information has been provided" . . . for illustrating histories of model numbers or sizes of tires of which information has been provided in the past, or "simulation condition".

As illustrated, for instance, in FIG. 16 in visualized form, the evaluation parameter database stores one evaluation parameter on a single record. The evaluation parameters are pieces of information for evaluating performances of tires, and include, in addition to general ones such as riding comfort, stability of steering, or wear performance, noise performance (pattern noise, load noise, impact noise, hollow resonance), drainage performance or rolling resistance. On one record, an evaluation parameter and a calculation parameter required for obtaining the evaluation parameter are stored in a pair.

For instance, when a customer selects "riding comfort" as an evaluation parameter, fluctuations in upward and downward force applied to the tire is calculated in the simulation while when he or she selects "stability of steering", "cornering power" is calculated in the simulation, respectively. In this respect, in case of a model in which the calculation accuracy of vehicle characteristics is increased, it is also possible to use a mechanism analysis (motion analysis) program to calculate evaluation parameters for the riding comfort of up and down/right and left oscillation on the floor or the sheet through dynamic motion simulation or as for the stability of steering, maximum turning lateral G or stability factor.

The control portion 5 of the present embodiment is illustrated to include a FEM analyzing portion 5a for performing simulation and a Web server 5b. The FEM analyzing portion 5a executes a specified simulation on the basis of the finite element method in accordance with conditions that have been set by a customer. It is desirable to use a high-speed computer of high processing performance such as a super computer as the FEM analyzing portion 5a. The Web server 5b discloses a part of the data storing portion 4 on a Web through the Internet for simplifying condition settings by customers and to receive results therefrom. The Web server 5b sends the received condition to the FEM analyzing portion 5a. The system arrangement of the control portion 5 is arbitrary, and the present invention is not limited to such an embodiment.

Client computers 3 provided at respective sales offices A, B, C . . . are connected to the Web server 5b of the main computer 2 such that they can communicate therewith through a network such as the Internet. Each client computer 3 comprises at least a display 3a for displaying data and a printer 3b for printing the data. These function as output portions for outputting evaluation parameters. Customers A, B . . . preferably own environments enabling usage computers 6, 7 with which they can make use of the Internet (WWW) or of e-mail. The computers 6, 7 comprise output portions such as at least displays. In this respect, it does not make any distinctions of style, either mobile computers or mobile phones unless it is possible to access the Internet.

Figure 17:
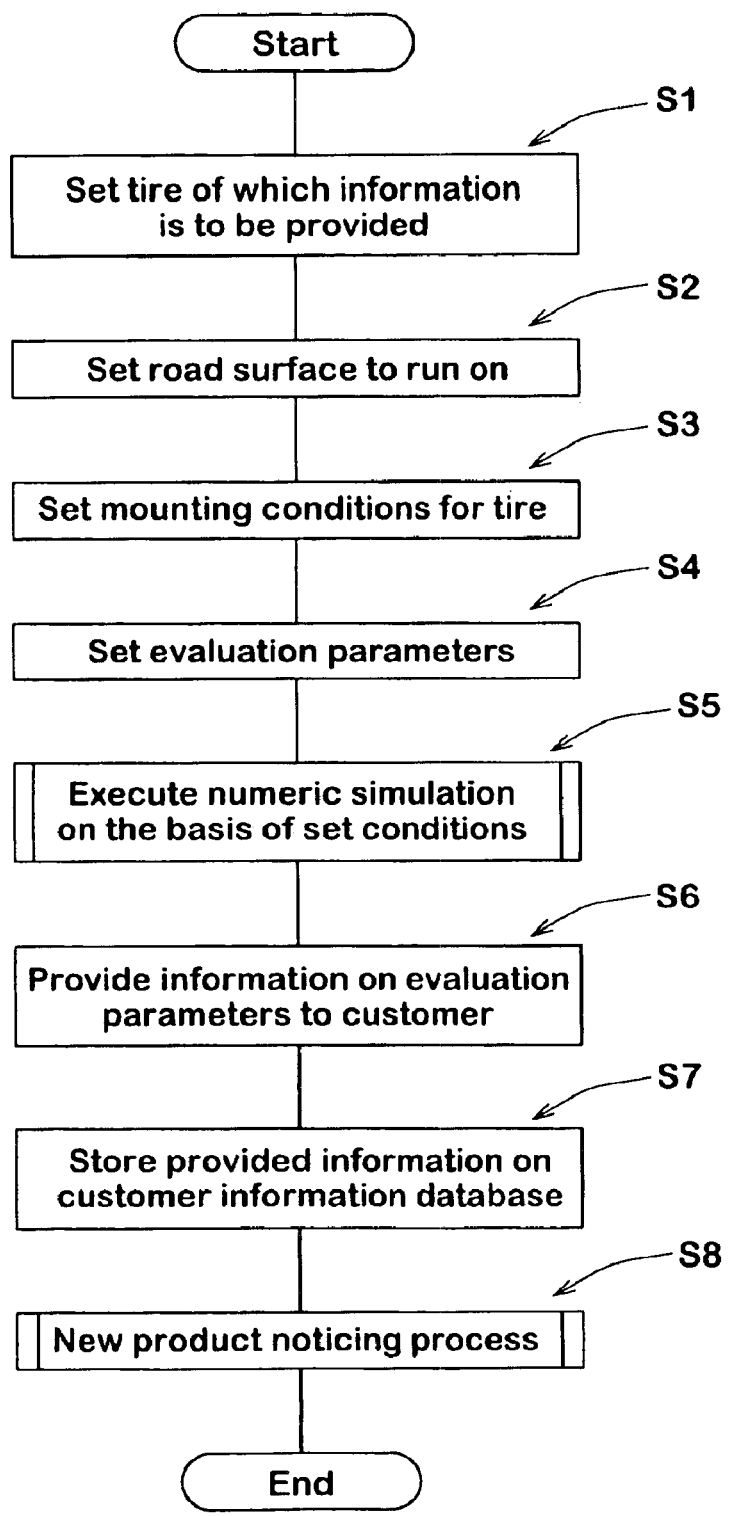
FIG. 17 is a flowchart illustrating one example of process steps of the tire information providing method according to the present embodiment.

FIG. 17 illustrates one example of a method for providing tire information according to the present embodiment.

For determining tire information to be provided to a customer in the method of the present invention, at least one tire, road surface of running, mounting condition and evaluation parameter of which the customer wants to be informed about are set (Step S1 to S4). Settings of the tire can be suitably determined, as explained above, by viewing the tire model database through the Internet and upon performing specified retrieval actions. By setting a tire, a tire model Tm corresponding to the tire can be identified. Simultaneously, setting of the road surface of running is performed by referring to the road surface model database. A road surface model Rm is set in accordance with the road surface of running. As for the mounting condition, the wheel model database and the car body database are browsed for respectively setting wheel to be mounted and a car body. The wheel model Wm and the car body model Bm are thus identified.

Mounting condition include, among others, internal pressure to be filled into the tire and condition of use. While recommended value of tire manufacturers may be used as initial value for the internal pressure, the customer may as well determine them arbitrarily. The conditions of use are input when the customer needs to be provided with information related to used tires or used vehicle body, and degradation processes of models are accordingly performed (to be described later). More particularly, numbers of months of use or running distances of the tire are input. The set conditions are sent to and stored in the FEM analyzing portion 5a through the Web server 5b.

It is desirable that two or more kind of conditions are set at least for one of the tire(tire model Tm), the road surface condition (road surface model Rm) and the mounting condition (wheel model Wm, car body model Bm). This will be useful in calculating and comparing evaluation parameters upon varying conditions. When two or more kind of tires are set, it is desirable at least one kind of tire that the customer is currently using is included therein. This will enable comparison with a currently used tire so that tire information can be more effectively provided. When two or more kind of tires are set, it is also desirable to include at least one tire recommended by tire manufacturers. Since the tire that is recommended by a tire manufactures is often superior in view of performance, the tire manufacturers may more strongly appeal differences in performance to customers.

Figure 18:
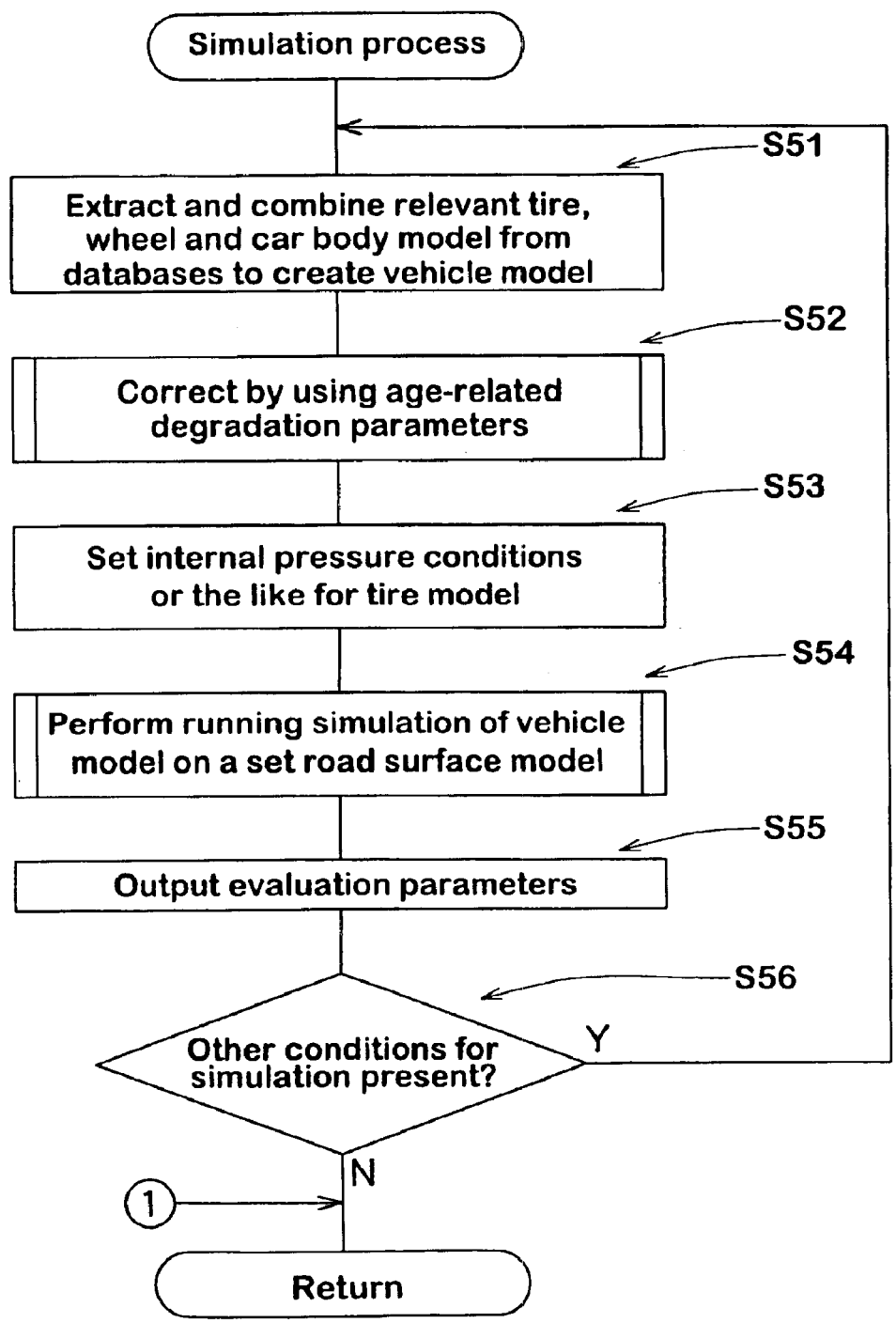
FIG. 18 is a flowchart illustrating one example of process steps of simulation.
Figure 19:
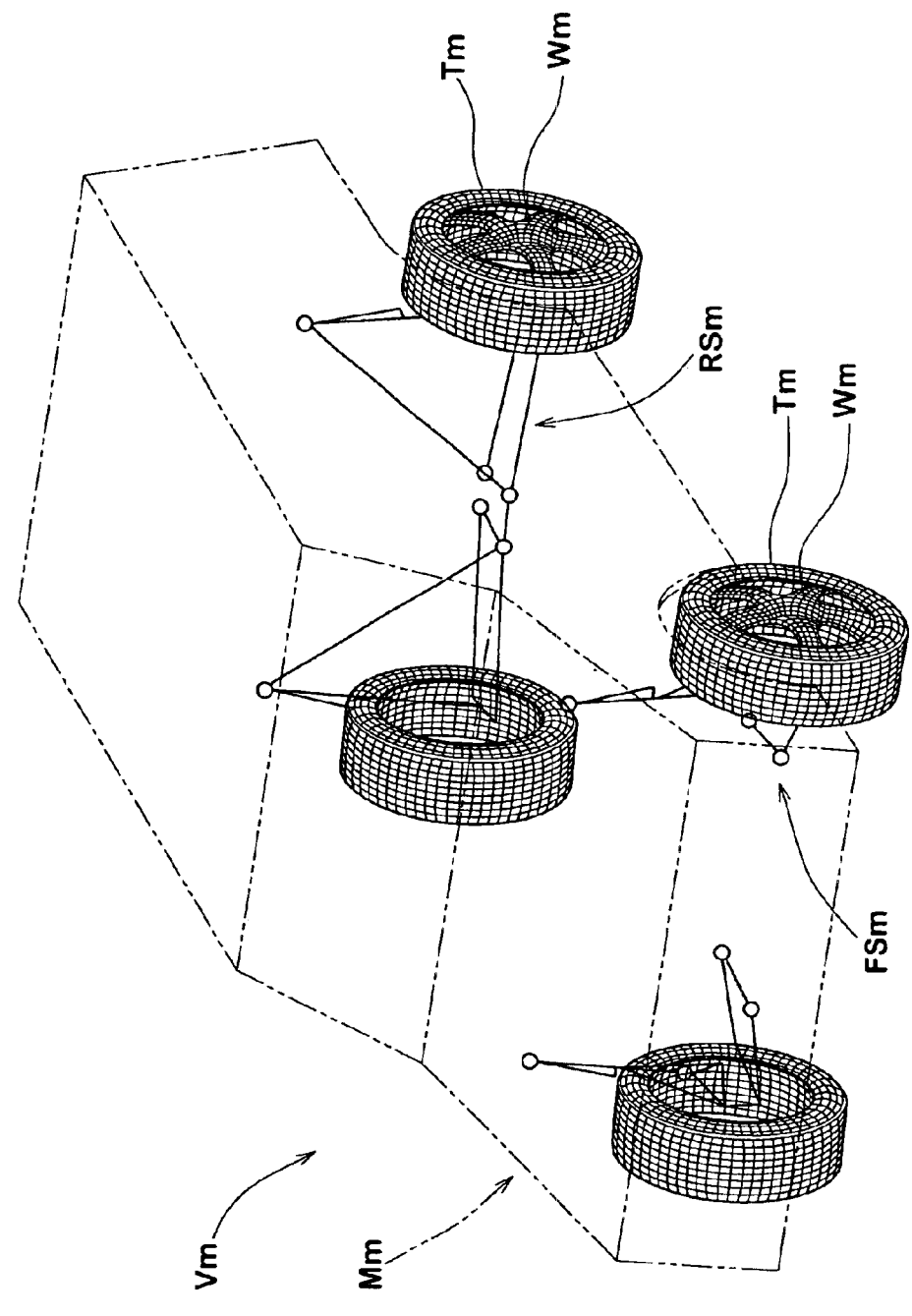
FIG. 19 is a perspective view illustrating one example of a vehicle model in visualized form.

Simulation is then executed on the basis of the set conditions (Step S5). The simulation is performed by the FEM analyzing portion 5a in accordance with process steps as exemplarily illustrated in FIG. 18. The FEM analyzing portion 5a is a combination of a hardware and a software, wherein an vehicle model Vm as illustrated in FIG. 19 is created by referring to the respective databases of the data storing portion 4 and by using the set tire model Tm, the wheel model Wm and the car body model Bm (Step S51). The vehicle model Vm is set by combining the respective suspension models FSm, RSm of the car body model Mm, the wheel model Wm and the tire model Tm in a numeric manner.

Correction processes by the degradation parameters are then performed (Step S52).

Figure 20:
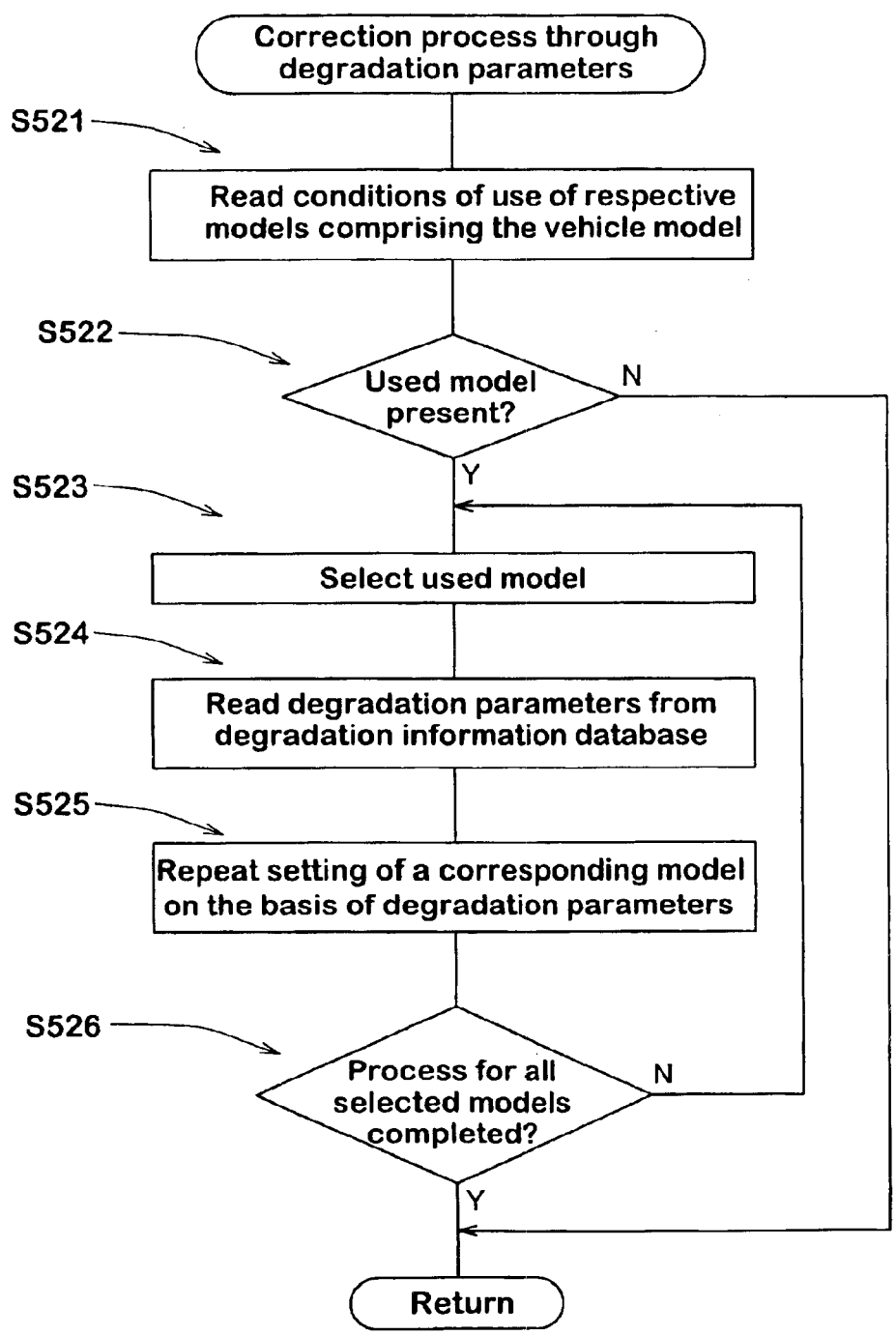
FIG. 20 is a flowchart illustrating one example of correction processes through degradation parameters.

As illustrated in FIG. 20, the correction processes are performed in that conditions of use of respective models constituting the vehicle model are first read from among conditions that have been preliminarily set by the customer (Step S521). The FEM analyzing portion 5a judges, from the conditions of use, the presence or absence of a used model (secondhand model) and if it is judged that no used model is present (N in Step S522), Step 53 and steps following thereafter in FIG. 18 are executed. On the other hand, if it is judged by the FEM analyzing portion 5a that a used model is present from the conditions of use (Y in Step S522), one of the used models is selected (Step S523).

The FEM analyzing portion 5a refers to the degradation information database to read degradation parameters related to the model in question (Step S524), and the model is corrected on the basis of the degradation parameters (Step S525). Through this correction, it is possible to degrade the hardness of rubber of the tire model Tm, to shallow the tread grooves, and to reduce the spring constants of the suspensions. In this manner, the vehicle model Vm comes even closer to conditions of an actual vehicle. When correction processes are performed for all models in the FEM analyzing portion 5a (Y in Step S256), Step S53 and steps following thereafter in FIG. 18 are executed. When it is judged that processes have not been completed (N in Step S526), Step S523 and steps following thereafter are repeated until correction processes are completed for all models.

Upon completion of correction processes through the degradation parameters, required conditions for internal pressure and other various conditions that are necessary are set for the tire model Tm (Step S53 in FIG. 18). Such various conditions are conditions that are necessary for calculating evaluation parameters, and moving speed, load, steering wheel input (slip angle) and/or braking input (slip rate) of the vehicle model are, for instance, set when the evaluation parameter is stability of steering.

The FEM analyzing portion 5a then performs simulation for making the vehicle model Vm run on the set road surface model Rm (Step S54) to output evaluation parameters (Step S55). The simulation is performed by, for instance, setting a dynamic equation on the basis of given conditions and the finite element method and by performing time integration thereof. More concretely, it is possible to employ an application software "LS-DYNA" manufactured by Livermore Software Technology Corporation (LSTC) for calculation. Through such simulation, required evaluation parameters can be sequentially calculated and output together with deformation shapes of respective portions, speed, acceleration and force (pressure).

Upon completion of one simulation, the FEM analyzing portion 5a judges whether other conditions for simulation are set or not (Step S56). When other simulation conditions are set (Y in Step S56), looping of Step S51 and steps following thereafter is performed. When no other conditions are set (N in Step S56), Step 6 and steps following thereto in FIG. 17 are performed.

Figure 21:
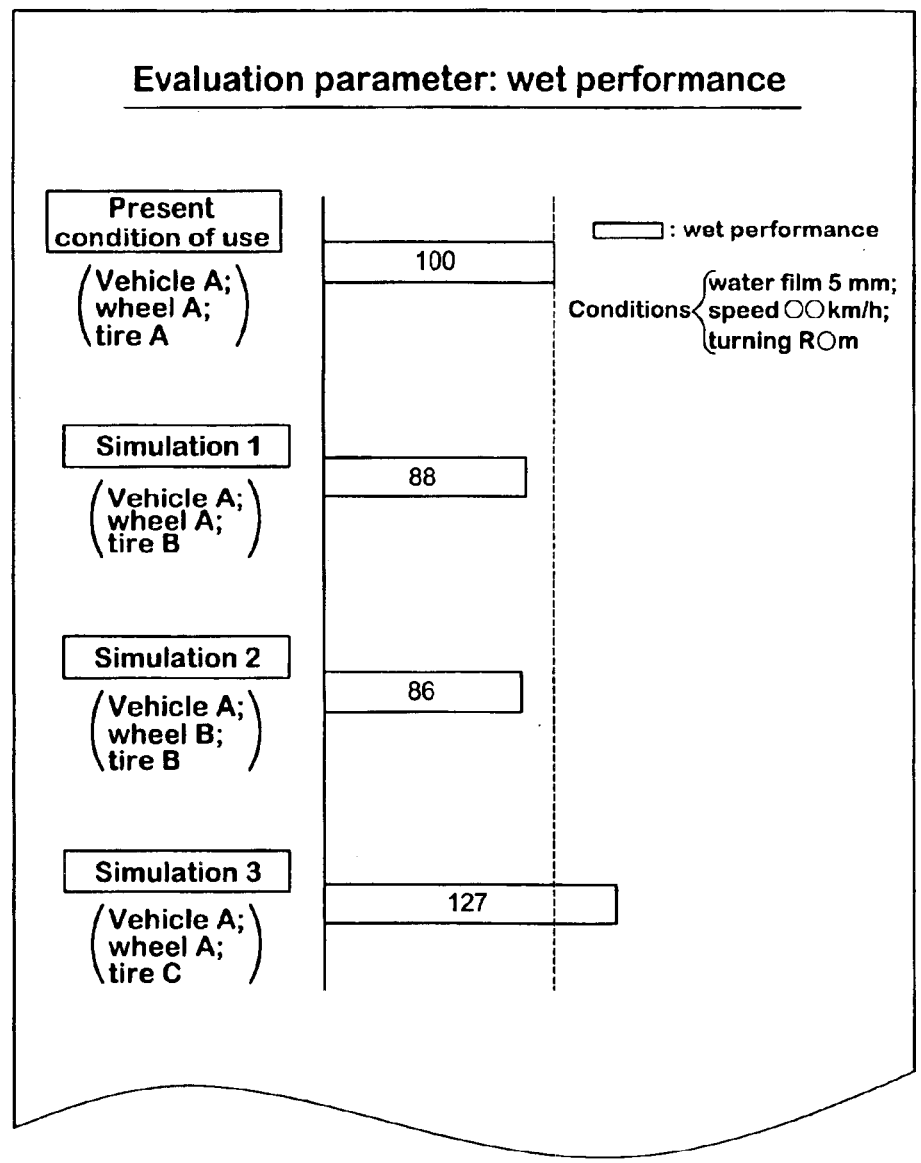
FIG. 21 is a diagram illustrating information on evaluation parameters that are provided to customers.

The FEM analyzing portion 5a performs processes of providing information on evaluation parameters to customers (Step S56). These processes include displaying on the display and printing. FIG. 21 illustrates one example of information on evaluation parameters. This embodiment illustrates a case in which "wet performance" is set as the evaluation parameter. Results are shown in which three types of tires A, B and C and two types of wheels A, B were set, and in which the following four simulation conditions were set.

(1) One that is identical to that of the vehicle the customer is currently using ("present condition of use").

(2) One in which the present condition of use is changed to tire B (simulation 1).

(3) One in which the present condition of use is changed to tire B and wheel B (simulation 2).

(4) One in which the present condition of use is changed to tire C (simulation 3).

The evaluation parameters are represented in a form of a bar graph with an index of the wet performance of the present condition of use being defined as 100, and evaluation parameters with different conditions are aligned vertically. It is therefore easy to represent comparison. On the basis of this information, the customer can understand that the performance is further degraded when compared to the current condition when using tire B. It can further be objectively understood that the performance will be further worsened when exchanging to wheel B and that an improvement in performance by 27% can be expected when changing from the present condition of use to tire C.

Figure 22:
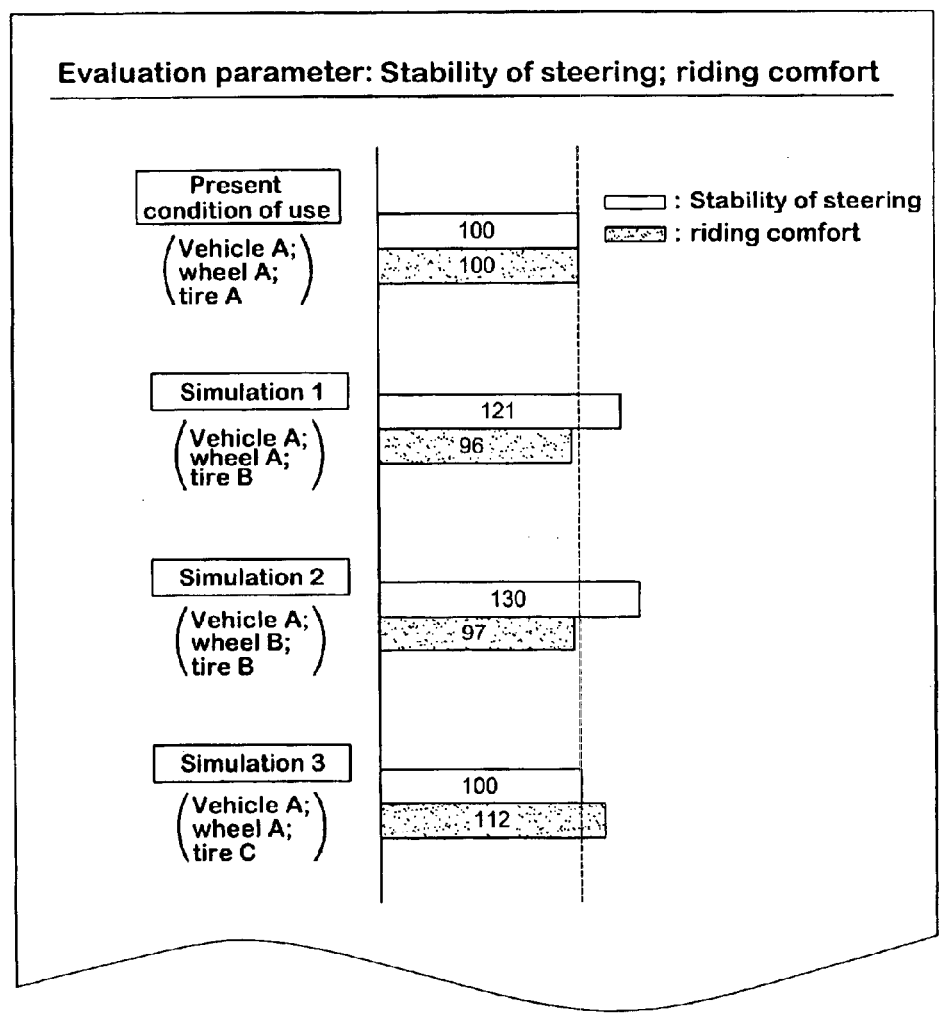
FIG. 22 is a diagram illustrating information on evaluation parameters that are provided to customers.

FIG. 22 illustrates an example of different information with different evaluation parameters.

The present embodiment illustrates a case in which both of "stability of steering" and "riding comfort" are set as the evaluation parameters. The conditions for the tire and the wheel and for the simulation are identical to those of the above (1) to (4). It is illustrated that while the stability of steering largely improves when compared to the present condition of use when using tire B in simulation 1, the riding comfort will be slightly degraded. Simulation 2 illustrates a further improvement in the steering stability upon exchanging wheels. On the other hand, simulation 3 illustrates that the riding comfort is improved while maintaining the current conditions of use and the stability of steering.

Such information on evaluation parameters as explained above are sent to the computer 6 or 7 that is being operated by the customer, and the customer is allowed to browse by using a Web browser or the like. In other words, the customer side does not require any particular software or similar. The above information may also be sent by communication means such as e-mail, facsimile or postal mail. While the above embodiments have been illustrated in that the evaluation parameters are displayed in a comparable manner by using a bar graph, it is possible to employ, for instance, a radar chart or to express them as numeric data, and the methods of expression are variously changeable.

According to the method of providing information of the present embodiment, it is possible to provide on-target information a customer truly wants to know. The customer may set conditions and receive information on evaluation parameters while being at home, and almost all of the processes are automated. Therefore, labor for both, tire manufacturers and the customers can be reduced. Complicated calculations such as simulations can be performed on the computer 2 disposed at the tire manufacturer side or the like so that it is not necessary to dispose expensive systems on customer's sides. As for tire information, by setting a plurality of conditions, it is possible to compare performances using evaluation parameters. This is objective and easy to understand. This means that the tire manufacturers may effectively advertise tires to customers. This will improve the buying inclinations of customers so that this will lead to promotion of sales of tires.

After providing information to the customer, the FEM analyzing portion 5a of the present embodiment stores at least a part of the information on the customer database (Step S7). Among pieces of information to be stored, at least information for defining tires of which information has been provided and simulation conditions are included, and these pieces of information are correlated with the customer. Thereafter, the FEM analyzing portion 5a performs new release product noticing processes (Step S8).

Figure 23:
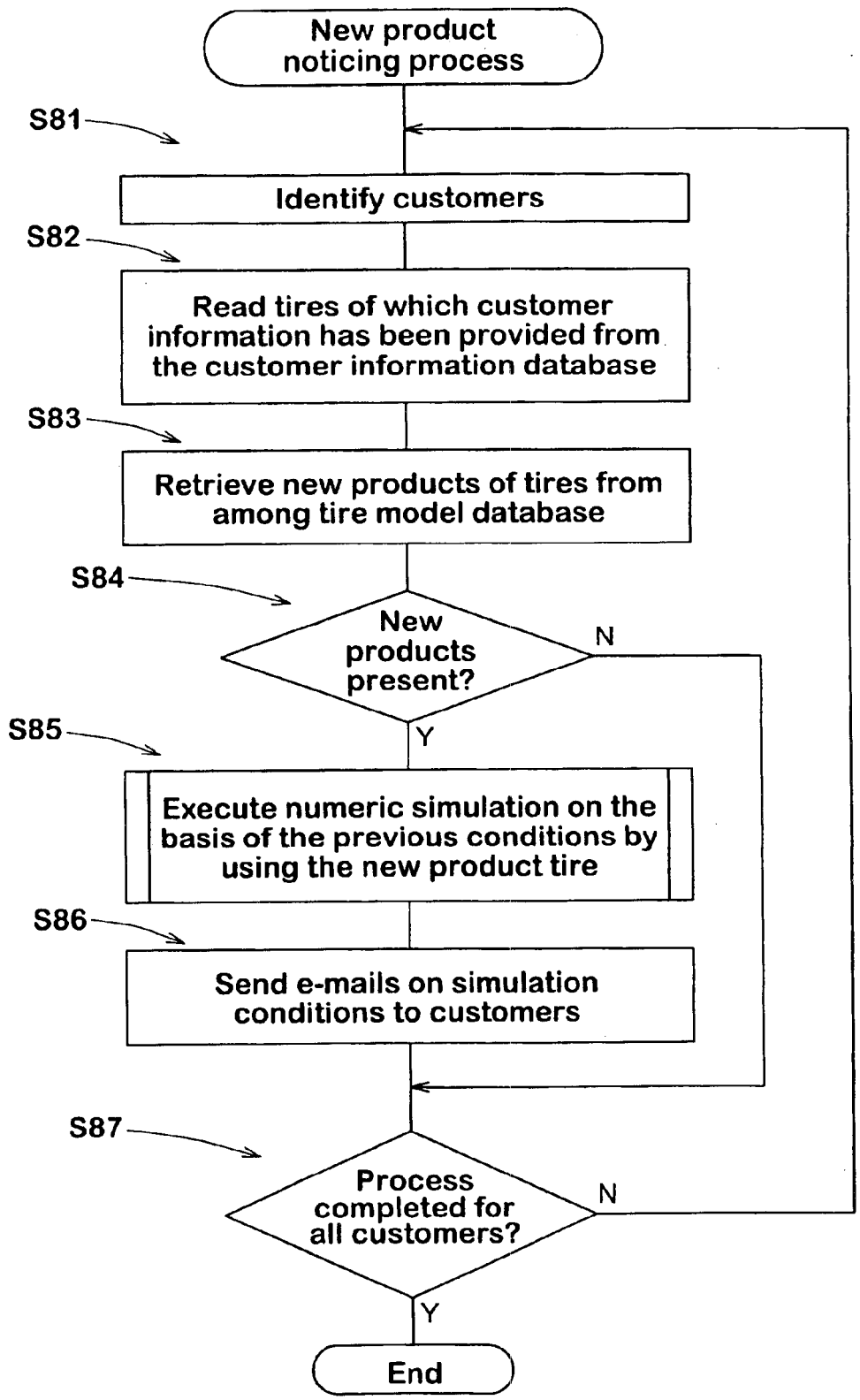
FIG. 23 is a flowchart illustrating one example of notification processes.

One example of process steps of the new product noticing processes is illustrated in FIG. 23.

First, the FEM analyzing portion 5a identifies one customer from a top record of the customer information database (Step S81), and information related to tires of which information has been provided to this customer in the past (for instance, type) is read (Step S82). Next, the FEM analyzing portion 5a performs retrieval whether any new products have been added for the read tire on the basis of the tire model database (Step S83). This can be identified by checking model numbers or the presence and absence of registrations of new tires of the same size.

When a new release tire has been added (Y in Step S84), the FEM analyzing portion 5a uses the new tire for performing simulation by using the same conditions as at the previous time (Step S85), and sends the results to the customer (Step S86). The transmission means are preferably e-mails. When no new products have been added (N in Step 84), it is judged whether processes have been completed for all customers, and when the answer is YES, the processes are terminated, and if NO, customers are changed to loop Step S82 and steps following thereafter. By including such notice processes, the customer may obtain performances of new product tires in accordance with conditions that meet preferences of the customers when new tires have been added. It is accordingly possible to provide tire information in an efficient manner without bothering the customers. New product tires may also be effectively advertised.

Figure 24:
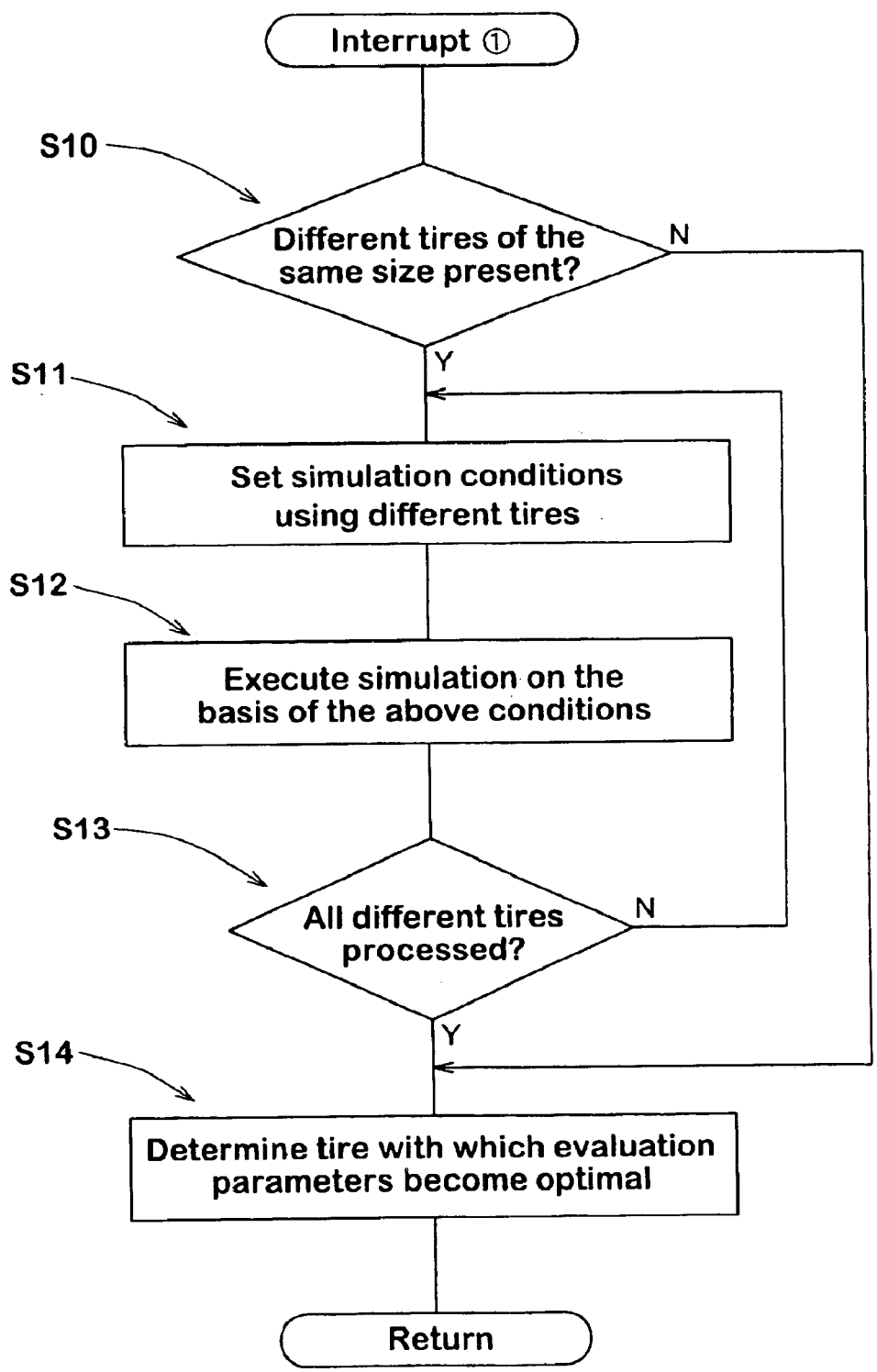
FIG. 24 is a flowchart illustrating other process steps of simulation.

FIG. 24 illustrates another embodiment of the present invention.

The present embodiment illustrates a case in which the FEM analyzing portion 5a refers conditions of tires as set by a customer, and in which processes of automatically estimating tires with optimal evaluation parameters are included. In a concrete process, interruption or the like is executed, for instance, after performing simulation processes in FIG. 18.

First, the FEM analyzing portion 5a judges whether any tires that are of the same size as tires of which simulation has been performed and that have not been listed in the conditions for simulation are present or not (Step S10). If other tires exist, one of the other tires is used for repeatedly setting a vehicle model for executing simulation (Step S11). The conditions for simulation may be identical as in the previous case except for the tire model Tm.

The FEM analyzing portion 5a executes simulation on the basis of the newly set conditions (Step S12). The FEM analyzing portion 5a judges whether simulation has been completed for all of the other tires (Step S13). When processes have not been completed for all of the other tires (Step S13), Step S11 and steps following thereafter are repeatedly executed. When processes have been completed (Y in Step S13), evaluation parameters are referred to from among simulation results, and a tire with which the evaluation parameters become optimal is selected (Step S14). This result is noticed to the customer in Step S6. At this time, it is particularly preferable when the optimal evaluation parameters and the evaluation parameters obtained from vehicle conditions that the current vehicle of the customer uses are provided to be comparable for the aim of confirming differences in performance.

While embodiments of the present invention have been explained in details so far, the present invention is not to be limited to the above embodiments, and it is possible to perform various interchanges of system arrangements or processes steps without departing from the gist of the present invention. For instance, the FEM analyzing portions 5a can be provided at respective sales offices instead of providing them at head quarters of tire manufacturers or the like. While the vehicle models have been illustrated on the basis of a four-wheeled passenger car, it is possible to include motorcycles, trucks or buses.

What is claimed is:

1. A tire information providing method for providing information on at least one kind of tire to a customer comprising the steps of:

setting at least one kind of tire of which information is to be provided;

setting at least one kind of road surface condition on which said tire is made to run;

setting at least one kind of mounting condition for mounting said tire;

setting at least one kind of evaluation parameter of said tire that is being wanted by said customer;

performing tire rolling simulation based on said tire, said road surface condition and said mounting condition;

getting said evaluation parameter from said tire rolling simulation; and providing information comprising said evaluation parameter to said customer.

2. The tire information providing method according to claim 1, wherein two or more kind of conditions are set at least for one of said tire, said road surface condition and said mounting condition, and wherein the step of providing information provides each evaluation parameters obtained on the basis of the respective conditions.

3. The tire information providing method according to claim 1, wherein two or more kind of tires from which the specification differs are set, wherein said tires comprise at least one kind of tire used by said customer and at least one kind of tire as recommended by a tire manufacturer or an automobile manufacturer.

4. The tire information providing method according to claim 1, wherein said mounting condition comprises at least one kind of wheel to which said tire are attached, at least one kind of suspension to which said wheel is mounted, and at least one kind of car main body to which said suspension is mounted.

5. The tire information providing method according to claim 4, wherein said wheel, said suspension and said car main body are set at substantially the same conditions as those of a vehicle said customer is using.

6. The tire information providing method according to claim 4 or 5, wherein at least for one of said tire, said wheel, said suspension and said car main body is corrected on the basis of at least one degradation parameter that change in accordance with said customer's status of use of said vehicle.

7. The tire information providing method according to claim 1, wherein in said step of performing tire rolling simulation, a plurality of simulations are performed by using at least two or more kind of tires, and wherein a tire having the best evaluation parameter is determined on the basis of the results of said simulations.

8. The tire information providing method according to claim 7, wherein said step of providing information provides a comparison between said best evaluation parameter with the evaluation parameter obtained on the basis of the current condition of the vehicle of the customer.

9. The tire information providing method according to claim 1, further comprising the step of:

storing at least one simulation condition including said tire, said road surface condition and said mounting condition at which said simulation has been performed in correlation with the customer;

generating at least one new simulation condition changing said tire into a new release tire;

performing at least one tire rolling simulation based on said new simulation condition; and noticing the results of said simulation to the customer.

10. A tire information providing apparatus for providing tire information to a customer comprising:

a data storing portion including at least one tire model database for storing two or more kind of tire models that can be simulated, a road surface model database for storing two or more kind of road surface models that can be simulated, and a car body model database for storing two or more kind of body models that can be simulated;

a control portion for setting a vehicle model on the basis of said tire models and said car body model that have been preliminarily set by the customer and for performing simulation upon making said vehicle model run on said road surface model that has been set by the customer; and an output portion for providing at least one evaluation parameter that has been preliminarily determined by the customer to the customer.

* * * * *